United States Patent
Aoki et al.

(10) Patent No.: US 6,642,826 B1
(45) Date of Patent: Nov. 4, 2003

(54) MAGNETIC FIELD GENERATOR AND ASSEMBLING METHOD THEREOF

(75) Inventors: Masaaki Aoki, Takatsuki (JP); Tsuyoshi Tsuzaki, Ibaraki (JP)

(73) Assignee: Sumitomo Special Metals Co., Ltd., Osaka (JP)

(*) Notice: Subject to any disclaimer, the term of this patent is extended or adjusted under 35 U.S.C. 154(b) by 0 days.

(21) Appl. No.: 09/920,928

(22) Filed: Aug. 3, 2001

(30) Foreign Application Priority Data

Aug. 9, 2000 (JP) ........................................ 2000-241609

(51) Int. Cl.$^7$ ................................................ H01F 5/00
(52) U.S. Cl. .......................... 335/299; 335/216; 335/301
(58) Field of Search ......................... 335/216, 296–302; 505/892.8; 324/318–321

(56) References Cited

U.S. PATENT DOCUMENTS

| | | | |
|---|---|---|---|
| 5,197,492 A | 3/1993 | Rawls, Jr. et al. | |
| 5,305,749 A | 4/1994 | Li et al. | |
| 5,565,834 A | 10/1996 | Hanley et al. | 335/296 |
| 6,023,165 A | 2/2000 | Damadian et al. | 324/318 |
| 6,075,364 A * | 6/2000 | Damadian et al. | 324/319 |

FOREIGN PATENT DOCUMENTS

| | | |
|---|---|---|
| JP | 5-41530 | 10/1993 |
| JP | 6-319714 | * 11/1994 |
| JP | 8-45729 | 2/1996 |
| JP | 9-313458 | * 12/1997 |
| JP | 11-178808 | 7/1999 |
| JP | 11-197131 | 7/1999 |
| JP | 11-197132 | 7/1999 |
| WO | WO-A-02/03090 | 1/2002 |

OTHER PUBLICATIONS

European Office Action dated May 14, 2002.
Patent Abstract of Japan; vol. 1996, No. 06, Jun. 28, 1996 & JP 08 045729 A (Sumitomo Special Metals Co Ltd), Feb. 16, 1996.
Patent Abstract of Japan; vol. 1999, No. 12, Oct. 29, 1999 * & JP 11 197132 A (Hitachi Medical Corp), Jul. 27, 1999.
Office Action to corresponding European Patent Application No. 01118979.2 dated Oct. 14, 2002.

* cited by examiner

*Primary Examiner*—Tuyen T. Nguyen
(74) *Attorney, Agent, or Firm*—Armstrong, Westerman & Hattori, LLP.

(57) ABSTRACT

A magnetic field generator comprises a pair of plate yokes opposed to each other with a space in between. Each plate yoke has a main surface on which a permanent magnet is disposed. A shielding magnet is provided each at a forward portion on an open side and at a rearward portion, of another main surface in the plate yoke. A magnetic spacer is placed between the plate yoke and the shielding magnet. When assembling, a shielding magnet is mounted on a main surface of the spacer, and then another main surface of the spacer is placed on the main surface of the plate yoke. The shielding magnet is covered by a nonmagnetic cover member. A distance not smaller than 2 mm is provided between an outer surface of the cover member and a surface of the shielding magnet. The plate yoke is provided with nonmagnetic legs.

10 Claims, 8 Drawing Sheets

F I G. 7

|     |                                         | Magnetic Field Strength | 1 mT Magnetic-Field Line |
|-----|-----------------------------------------|-------------------------|--------------------------|
| (1) | No members                              | 0.3597 T                | 2.35 m                   |
| (2) | Iron Spacer                             | 0.3602 T                | 2.25 m                   |
| (3) | Shielding Magnet (Attached Directly)    | 0.3584 T                | 2.03 m                   |
| (4) | Shielding Magnet and Nonmagnetic Spacer | 0.3588 T                | 2.07 m                   |
| (5) | Shielding Magnet and Iron Spacer        | 0.3593 T                | 1.93 m                   |

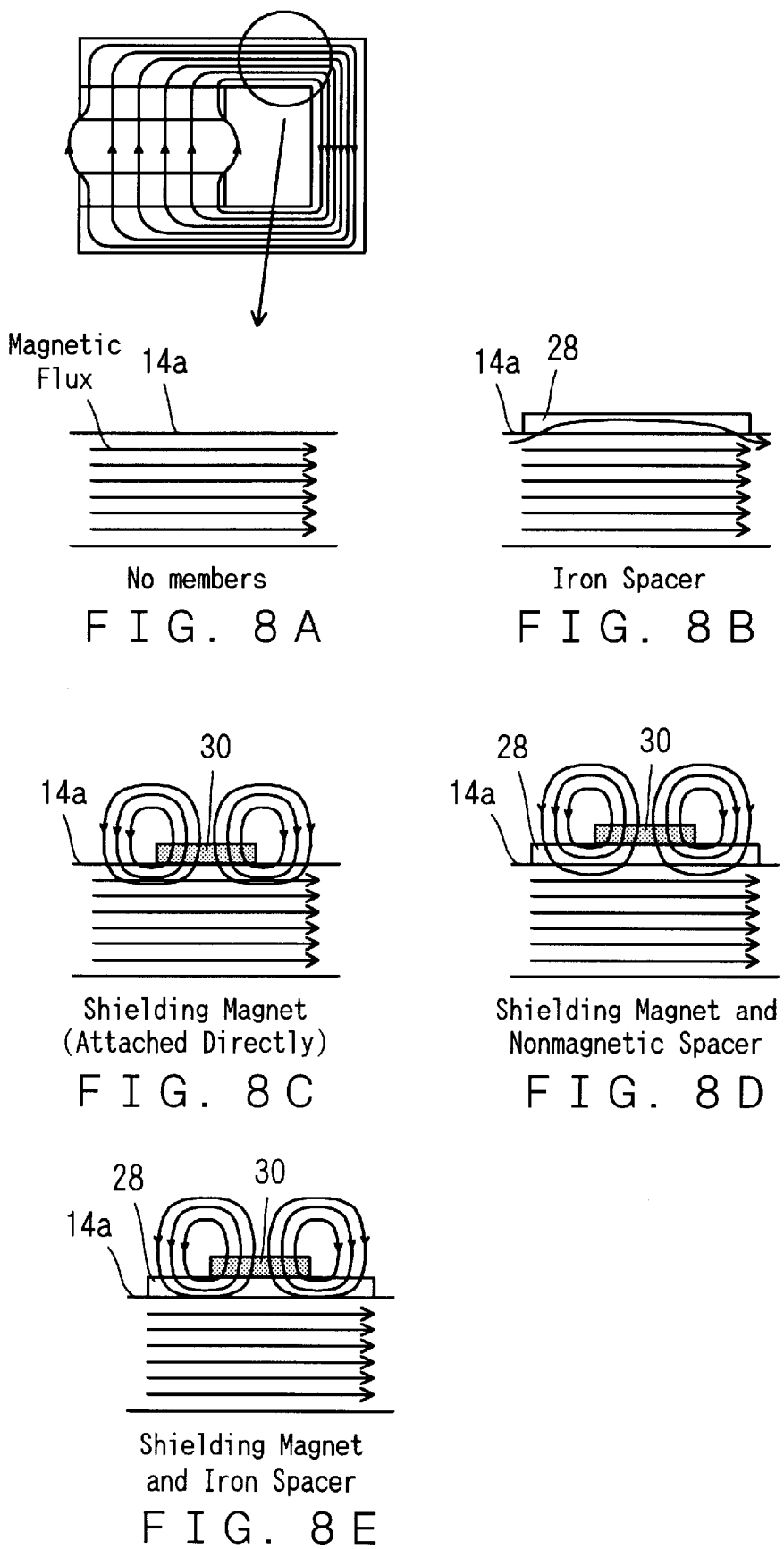

MAGNETIC FIELD GENERATOR AND ASSEMBLING METHOD THEREOF

BACKGROUND OF THE INVENTION

1. Field of the Invention

The present invention relates to a magnetic field generator and an assembling method thereof. More specifically, the present invention relates to a magnetic field generator for MRI and an assembling method thereof.

2. Description of the Related Art

Japanese Utility Model Publication (of examined Application for opposition) No. 5-41530 discloses a technique for reducing magnetic flux leakage in a magnetic field generator for MRI. According to the technique, a plate yoke has a main surface and another surface facing away therefrom. Permanent magnet blocks are disposed in said another surface of the plate yoke. On the main surface, shielding magnets provided by eight ferrite magnets are disposed in an annular pattern, correspondingly to an outer circumference of the permanent magnet blocks, thereby reducing the magnetic flux leakage.

However, according to this related art, it is difficult to effectively reduce the magnetic flux leakage in a magnetic field generator for MRI which generates an intense magnetic field not smaller than 0.3 T. It is also difficult to effectively reduce the magnetic flux leakage in an open type magnetic field generator for MRI which generates such an intense magnetic field.

Further, according to the above related art, the shielding magnets are exposed on an outer side of the magnetic field generator, potentially attracting such a magnetic object as a tool and/or a chain, during assembling and/or transportation. In such an instance, the shielding magnets, which are sintered bodies, can be destroyed when the attracted object hits the shielding magnets. Another problem is that if the object is large, the object sometimes cannot be taken off by a human power once it is drawn onto the shielding magnets.

Further, a recent magnetic field generator for MRI has legs. The legs are magnetic, and are attached to the main surface of the plate yoke after the shielding magnet are fixed (bonded) onto the main surface of the plate yoke. During the attaching operation, the legs can be pulled by the shielding magnets, potentially causing a danger to workers.

These problems are conspicuous when utilizing sintered rare-earth magnets, which have strong magnetism, as the shielding magnets for a purpose of weight reduction of the magnets.

Further, recently, there is proposed and prevailing a magnetic field generator having a continuous open space as wide as not smaller than 150 degrees as viewed from the center of the magnetic field generating space, in a front portion of the generator. In such a generator, magnetic flux leakage is large in the open space, and the problem becomes more conspicuous if the plate yoke of the generator has its front portion sloped for reduced weight, or generates an intense magnetic field not smaller than 0.3 T. The magnetic flux leakage can be reduced to a certain extent by increasing thickness of the plate yoke at the front portion of the generator. However, this is impossible in the magnetic field generator having a continuous open space as wide as not smaller than 150 degrees, due to an instable support structure.

SUMMARY OF THE INVENTION

It is therefore a primary object of the present invention to provide a magnetic field generator capable of reducing the magnetic flux leakage i.e. unwanted magnetic field outside of the magnetic field generator, more effectively.

Another object of the present invention is to provide a magnetic field generator capable of preventing damage to the shielding magnets.

Still another object of the present invention is to provide a magnetic field generator and an assembling method thereof, that can be assembled safely.

According to an aspect of the present invention, there is provided a magnetic field generator comprising: a pair of plate yokes opposed to each other with a space in between; a permanent magnet disposed on a main surface of each plate yoke, the two main surfaces being opposed. to each other; a shielding magnet provided on another main surface, in at least one of the plate yokes; and a spacer placed between the plate yoke and the shielding magnet.

According to this invention, by providing a spacer, the shielding magnet can be spaced off the plate yoke. Therefore, magnetic saturation of the plate yoke can be suppressed or eased, and therefore the magnetic flux leakage can be reduced without decreasing the magnetic field strength in the space between the pair of plate yokes.

Preferably, the spacer is made of magnetic material. Use of a magnetic member as the spacer enables to virtually thicken the yoke at a place prone to magnetic saturation. This decreases magnetic reluctance, thereby increasing magnetic field strength in the space without major increase in weight.

According to another aspect of the present invention, there is provided a magnetic field generator comprising: a pair of plate yokes opposed to each other with a space in between; not more than two supporting yokes magnetically connecting the plate yokes; a permanent magnet disposed on a main surface of each plate yoke, the two main surfaces being opposed to each other; and a first shielding magnet and a second shielding magnet provided respectively at a forward portion on an open side and at a rearward portion, of another main surface, in at least one of the plate yokes.

According to this invention, provision of the first shielding magnet in the forward portion on the open side of said another main surface of the plate yoke enables to reduce unwanted magnetic flux leakage from the front portion of the generator. Further, the second shielding magnet enables to reduce magnetic flux leakage at the rear portion of the generator.

According to another aspect of the present invention, there is provided a magnetic field generator comprising: a pair of plate yokes opposed to each other with a space in between; a permanent magnet disposed on a main surface of each plate yoke, the two main surfaces being opposed to each other; a shielding magnet provided on another main surface, in at least one of the plate yokes; and cover member provided over the shielding magnet.

According to this invention, the cover member protects the shielding magnet, enabling to prevent damage to the shielding magnet.

Preferably, the cover member is made of nonmagnetic material. This enables to reliably reduce the magnetic flux leakage without shorting the magnetic flux generated by the shielding magnet.

Further, preferably, a distance not smaller than 2 mm is provided between an outer surface of the cover member and a surface of the shielding magnet. With this arrangement, attraction exerted to a magnetic object (such as a tool) by the shielding magnet can be decreased. Therefore, even if the magnetic object is drawn to stick, it can be removed easily from the cover member.

According to still another aspect of the present invention, there is provided a magnetic field generator comprising: a pair of plate yokes opposed to each other with a space in between; a permanent magnet disposed on a main surface of each plate yoke, the two main surfaces being opposed to each other; a shielding magnet provided on another main surface, in at least one of the plate yokes; and a nonmagnetic leg formed on said another main surface of the plate yoke on which the shielding magnet is provided.

According to this invention, since the legs are nonmagnetic, the legs are not drawn to the shielding magnet at a time of assembling operation, and therefore the workers are no longer exposed to the danger.

According to still another aspect of the present invention, there is provided a magnetic field generator comprising: a pair of plate yokes opposed to each other with a space in between; a permanent magnet disposed on a main surface of each plate yoke, the two main surfaces being opposed to each other; a supporting yoke magnetically-connecting the plate yokes and providing a continuous open space having an opening angle not smaller than 150 degrees as viewed from a center of a uniform magnetic field space between the permanent magnets; and a shielding magnet provided correspondingly to the open space, on another main surface, in at least one of the plate yokes.

In an open type magnetic field generator such as the above, there is a large magnetic flux leakage on the open side of the generator. Therefore, it is effective to provide a shielding magnet at a location of the plate yoke corresponding to the open space.

Preferably, the plate yoke has a gradually decreasing thickness, with said another main surface of the plate yoke having a sloped surface, and the shielding magnet is provided on the sloped surface. Magnetic flux leakage increases if part of the plate yoke is cut off for weight reduction of the generator. Therefore, it is effective to provide a shielding magnet at a place where the plate yoke is thinned.

The present invention is suitable for a magnetic field generator which generates a magnetic field not smaller than 0.3 T in the uniform magnetic field space. Magnetic flux leakage is larger in a magnetic field generator which generates such an intense magnetic field. Therefore, it is effective to provide a shielding magnet.

Preferably, the shielding magnet is a sintered rare-earth magnet. By using the sintered rare-earth magnet, which has strong magnetism, as the shielding magnet, together with the spacer, magnet flux leakage can be reduced more effectively with a smaller amount of magnet, without causing magnetic saturation.

According to still another aspect of the present invention, there is provided a method of assembling a magnetic field generator having a plate yoke, the method comprising steps of: first mounting a shielding magnet on a main surface of a spacer, and then placing another main surface of the spacer on a main surface of the plate yoke.

According to this invention, the shielding magnet is attached in advance to the spacer, and the spacer as mounted with the shielding magnet is attached to the main surface of the plate yoke. Therefore, the shielding magnet can be installed easily to a desired location on the spacer, and the magnetic field generator can be assembled safely.

The above object, other objects, characteristics, aspects and advantages of the present invention will become clearer from the following description of an embodiment to be presented with reference to the accompanying drawings.

BRIEF DESCRIPTION OF THE DRAWINGS

FIG. 7 is a table showing a result of an experiment; and

FIG. 8A~FIG. 8E are diagrams illustrating the result of the experiment.

DETAILED DESCRIPTION OF THE PREFERRED EMBODIMENTS

Figure 1:
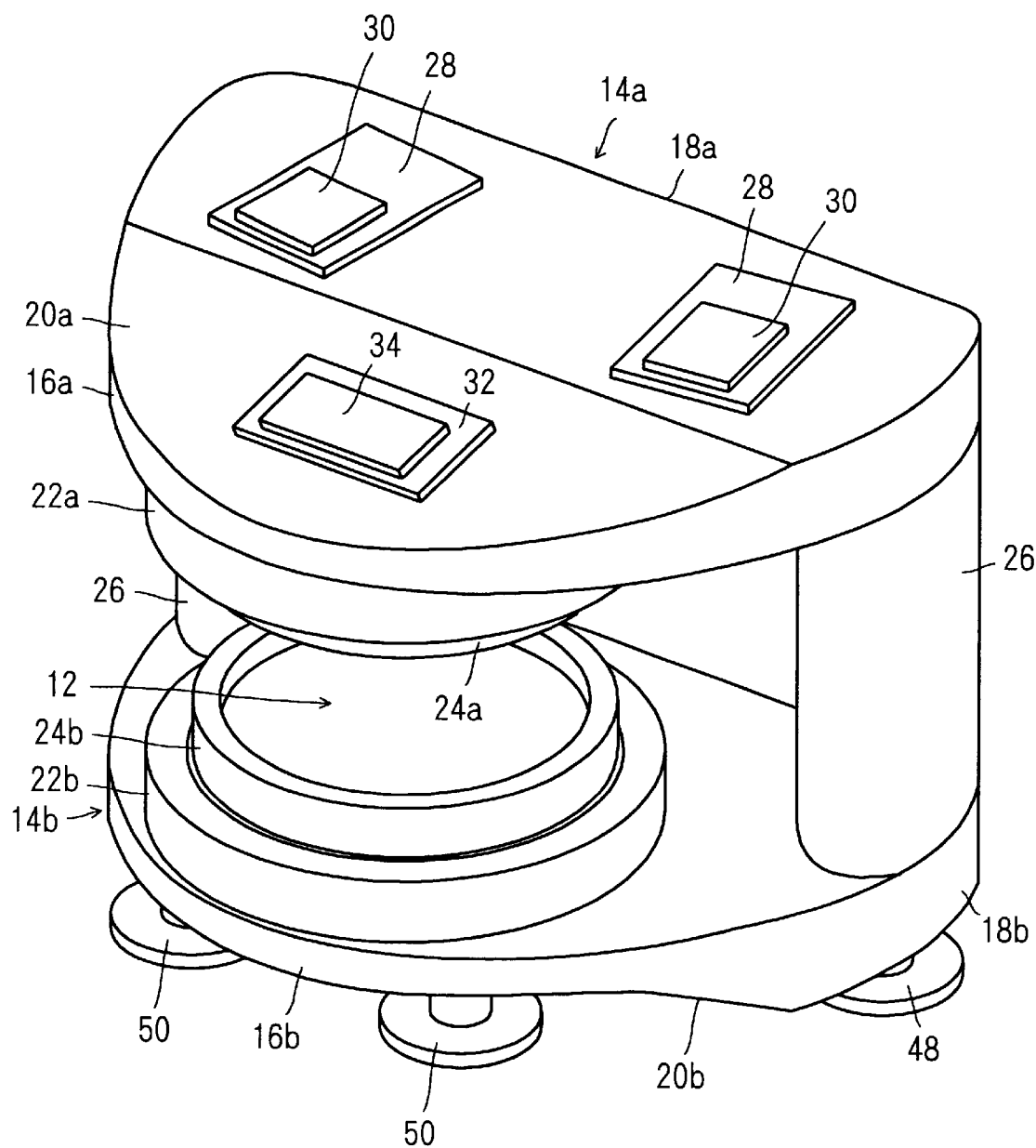
FIG. 1 is a perspective view of an embodiment of the present invention.

Now, a preferred embodiment of the present invention will be described with reference to the drawings.

Referring to FIG. 1 through FIG. 4, a magnetic field generator 10 for MRI as an embodiment of the present invention is an open type magnetic field generator, and includes a pair of plate yokes 14a, 14b opposed to each other, with a space 12 in between. The plate yoke 14a includes a front portion 16a which is on an open side, and a rear portion 18a. The front portion 16a has an upper surface provided by a sloped surface 20a. The plate yoke 14a is gradually thinner toward the front of the open space, for a purpose of yoke weight reduction. Likewise, The plate yoke 14b includes a front portion 16b which is on an open side, and a rear portion 18b. For the purpose of yoke weight reduction, the front portion 16b is made thinner than the rear portion 18b. The front portion 16b has a sloped surface 20b in its bottom surface, which leads to a bottom surface of the rear portion 18b.

Figure 2:
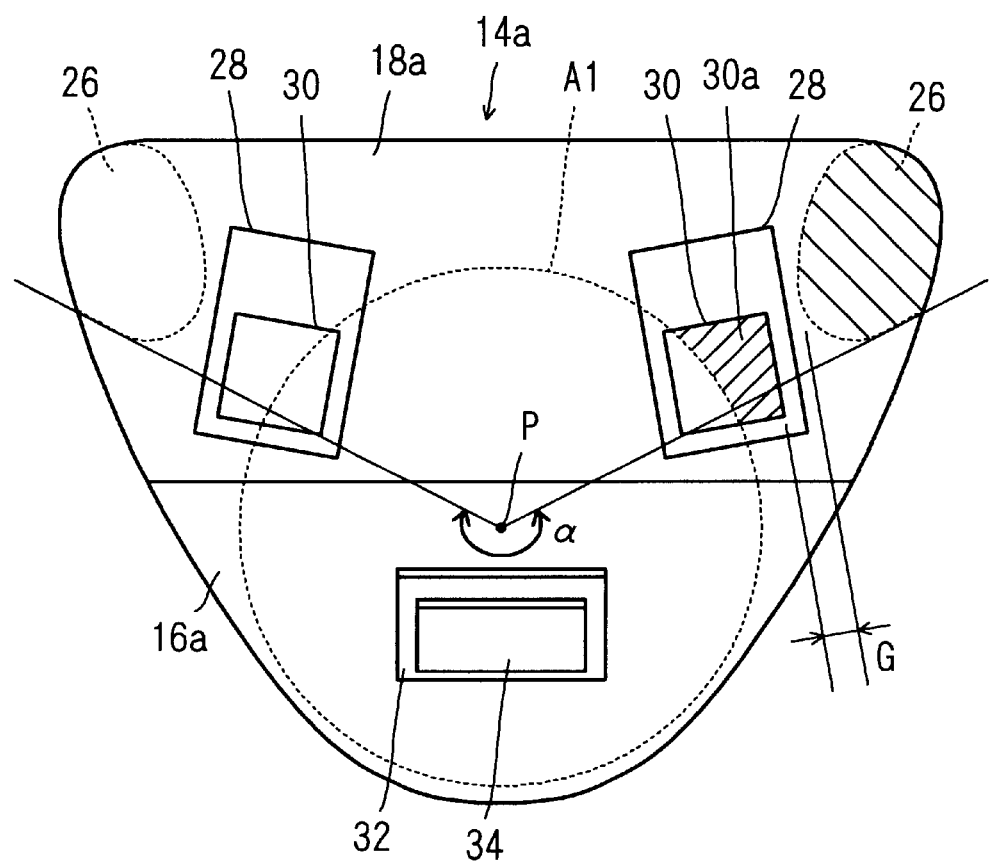
FIG. 2 is a plan view of the embodiment of the present invention.
Figure 3:
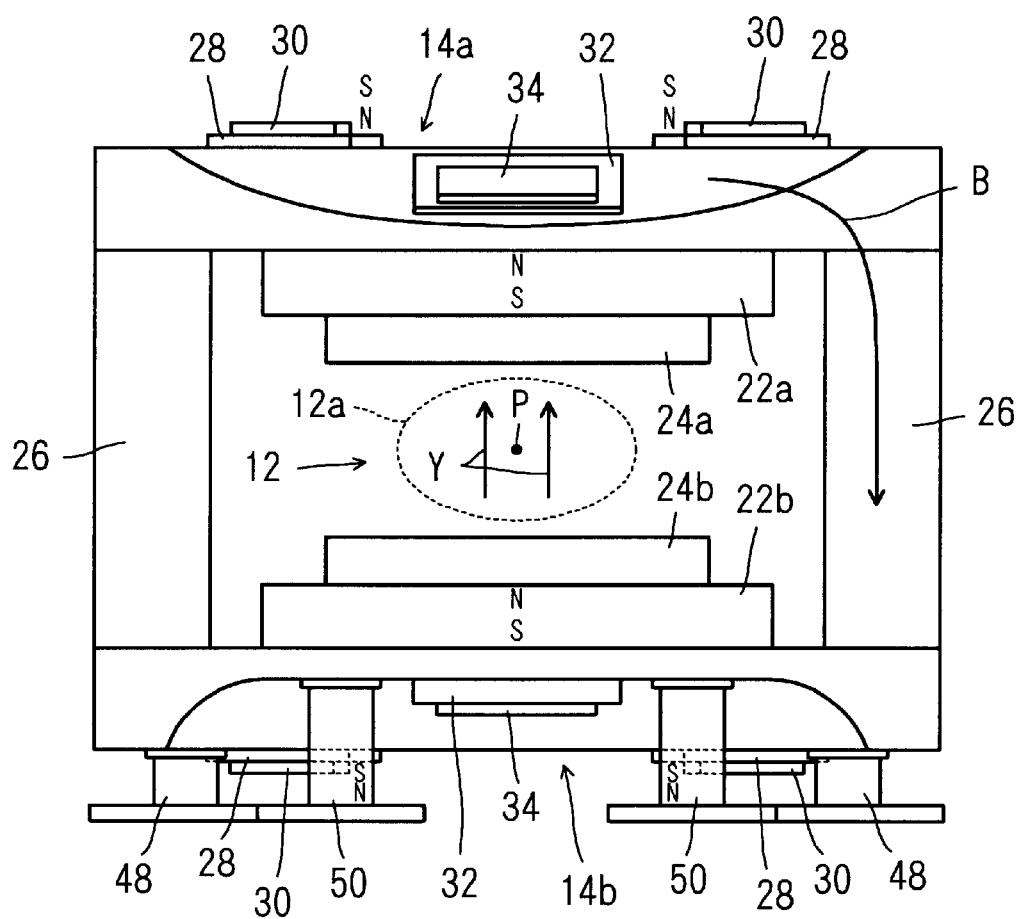
FIG. 3 is a front view of the embodiment of the present invention.

The plate yokes 14a, 14b have respective surfaces facing each other, on which permanent magnets 22a, 22b are disposed respectively. The permanent magnets 22a, 22b have respective surfaces facing each other, on which pole pieces 24a, 24b are fixed respectively. The pair of plate yokes 14a, 14b are magnetically connected by two columnar supporting yokes 26 disposed between and at two respective edge portions of the rear portions 18a, 18b. The plate yokes 14a, 14b and the supporting yokes 26 are made of soft iron. As described above, in the open type magnetic field generator 10, the supporting yokes 26 are disposed in a rearward location of the generator. Such a construction provides, as shown in FIG. 3, a uniform magnetic field space 12a between the permanent magnets 22a, 22b, with a magnetic flux as shown by Arrow Y. With this arrangement, as shown in FIG. 2, the supporting yokes 26 are disposed so as to provide a continuous open space having an opening angle α not smaller than 150 degrees as viewed from the center P of a uniform magnetic field space 12a formed between the permanent magnets 22a, 22b. The open space is a space not occupied by the supporting yokes 26.

The rear portion 18a of the plate yoke 14a has an upper surface provided with two rectangular, board-shaped spacers 28 disposed in symmetry. Each of the spacers 28 has an upper surface provided with a generally square, board-shaped shielding magnet 30. In other words, two shielding magnets 30 are provided at a rearward portion of the upper surface of the plate yoke 14a. As understood from FIG. 2, on the plate yoke 14a, each of the shielding magnets 30 has its portion 30a being out of an outer circumferential edge A1 of the permanent magnet 22a (provided on the other surface). No part of the shielding magnet 30 overlaps the corresponding supporting yoke 26, and the shielding magnet 30 is spaced from the corresponding supporting yoke 26 by a gap G. As shown by Arrow B in FIG. 3, the supporting yoke 26 provides a magnetic path, and magnetic flux concentrates where the plate yoke 14a is connected with the supporting yoke 26. For this reason, part of the plate yoke 14a at the gap G is subject to magnetic saturation. By disposing the shielding magnet 30 out of a region prone to magnetic saturation as the above, magnetic flux leakage can be reduced without promoting the magnetic saturation, making sure to hold a desired magnetic field strength at a center region of the space 12.

Further, the sloped surface 20a of the upper surface of the front portion 16a in the plate yoke 14a is provided with a rectangular, board-shaped spacer 32. The spacer 32 has an upper surface provided with a rectangular, board-shaped shielding magnet 34. In other words, the shielding magnet 34 is provided at a forward portion on an open side of the upper surface of the plate yoke 14a. In general, magnetic flux leakage is greater on the open side, in the open type magnetic field generator 10. Thus, by disposing the shielding magnet 34 in the front portion 16a of the generator, the magnetic flux leakage can be further reduced.

The spacers 28, 32 are made of a soft magnetic iron, and have a thickness for example of 30 mm. The shielding magnets 30, 34 can be made, for example, of a plurality of unit magnets each being a rectangular parallelepiped having a size of 35×50×50 mm. The unit magnets are assembled to provide magnetism against the direction of the magnetic flux leakage. The shielding magnets 30, 34 can be sintered neodymium magnets (sintered R-Fe-B magnets), samarium-cobalt magnets, alnico magnets, or ferrite magnets. Of these magnets, the ferrite magnet is heavy, and can be demagnetized during transportation if exposed to a temperature as low as −20° C. A magnet having a high energy product can provide a high shielding effect. Besides, it is necessary to use thin magnets thereby making the generator small. For these reasons, it is desirable to use a sintered rare-earth magnet. The magnet should have a coercive force of not smaller than 1000 kA/m in general, but the magnet having a higher coercive force is desirable if the magnet is exposed to a high temperature during transportation. The permanent magnets 22a, 22b may be provided by, for example, NEOMAX-47 manufactured by Sumitomo Special Metals Co., Ltd (SSMC). The shielding magnets 30, 34 may be provided by, for example, NEOMAX-39SH manufactured by SSMC. The sintered R—Fe—B magnet is disclosed in the U.S. Pat. Nos. 4,770,723 and 4,792,368.

Figure 4:
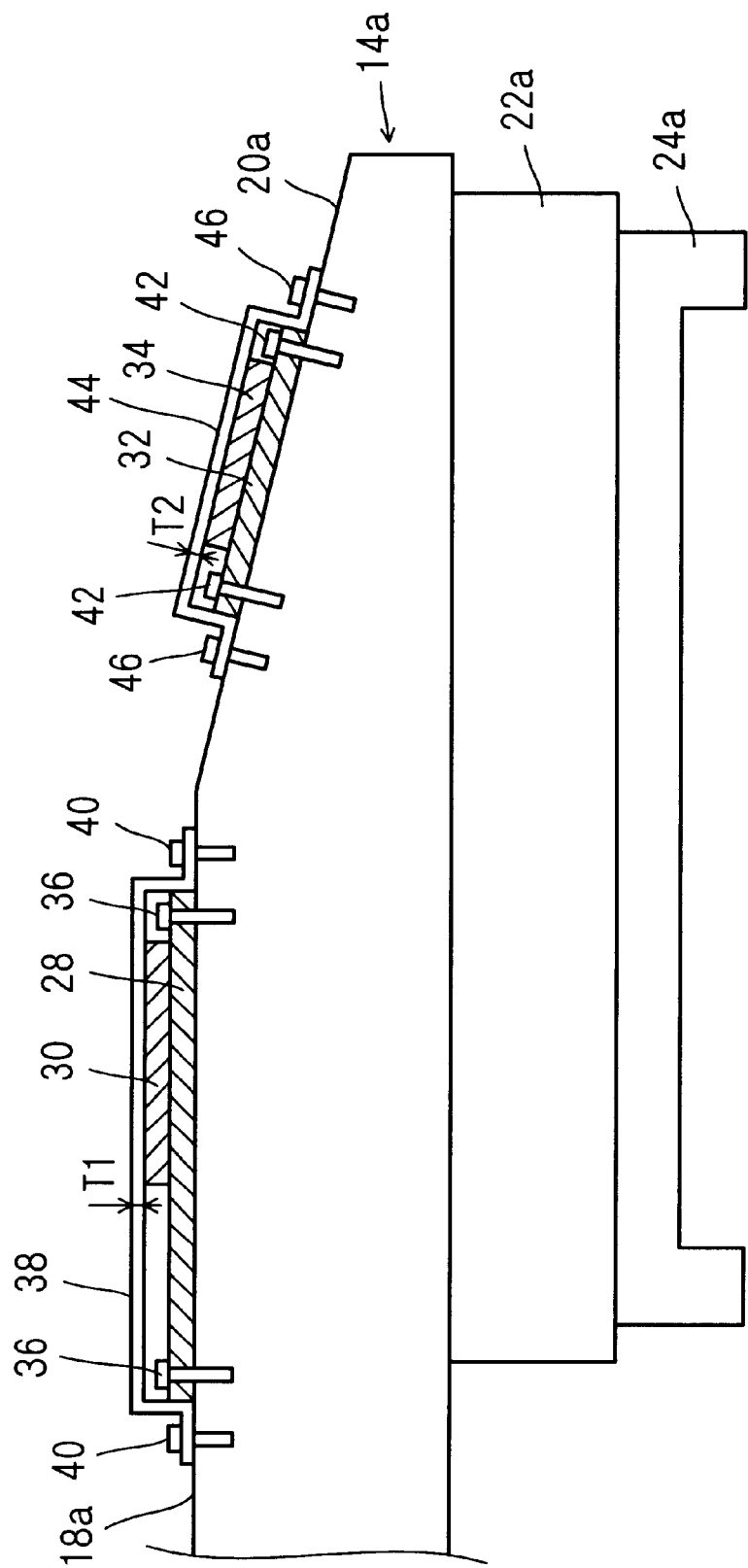
FIG. 4 is a diagram showing a state in which a cover member is attached.

As shown in FIG. 4, the spacer 28 is fixed to the plate yoke 14a by spacer mounting screws 36. The spacer 28 and the shielding magnet 30 are covered by a cover member 38. The cover member 38 is a nonmagnetic member made, for example, of SUS 304, and is fixed to the upper surface of the rear portion 18a of the plate yoke 14a by cover mounting screws 40. The spacer 32 is fixed by spacer mounting screws 42. The spacer 32 and the shielding magnet 34 are covered by a cover member 44. The cover member 44 is also a nonmagnetic member made, for example, of SUS 304 (stainless steel), and is fixed to the sloped surface 20a of the front portion 16a of the plate yoke 14a by cover mounting screws 46. The shielding magnets 30, 34 are each made of a plurality of unit magnets, and the unit magnets are bonded to the respective spacers 28, 32, side by side with their same poles faced to each other. Should any of the unit magnets detach accidentally, the unit magnet can be shot out by the repulsion. The cover members 38, 44 prevent this accident. In this arrangement, a distance T1 which is not smaller than 2 mm is provided between an outer surface of the cover member 38 and an upper surface of the shielding magnet 30. Likewise, a distance T2 which is not smaller than 2 mm is provided between an outer surface of the cover member 44 and an upper surface of the shielding magnet 34.

Figure 5:
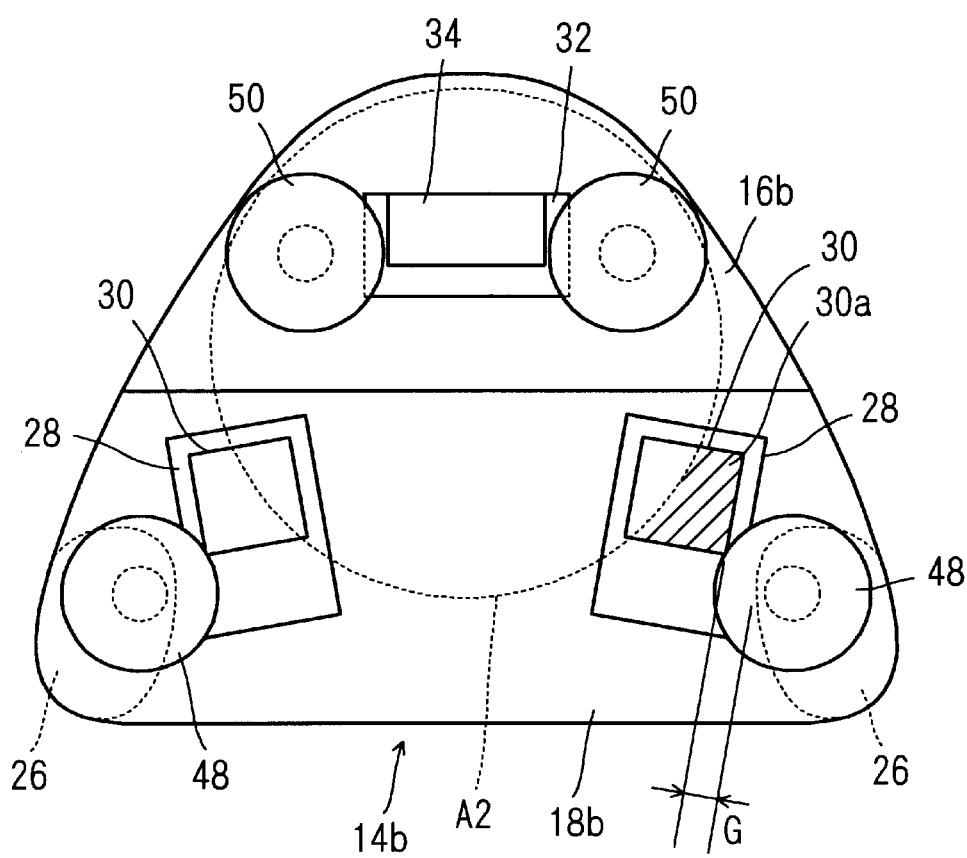
FIG. 5 is a bottom view of the embodiment of the present invention.

As shown in FIG. 5, a similar arrangement is provided for the plate yoke 14b. Specifically, the rear portion 18b of the plate yoke 14b has a lower surface provided with two spacers 28 disposed in symmetry. Each of the spacers 28 has a surface provided with a shielding magnet 30. In other words, two shielding magnets 30 are provided at a rearward portion of the lower surface of the plate yoke 14b. As understood from FIG. 5, on the plate yoke 14b, each of the shielding magnets 30 has its portion 30a being out of an outer circumferential edge A2 of the permanent magnet 22b. No part of the shielding magnet 30 overlaps the corresponding supporting yoke 26, and the shielding magnet 30 is spaced from the corresponding supporting yoke 26 by a gap G. Further, a spacer 32 is provided on a flat surface of the lower surface in the front portion 16b of the plate yoke 14b. The spacer 32 has a surface provided with a shielding magnet 34. In other words, the shielding magnet 34 is provided at a forward portion on an open side of the lower surface of the plate yoke 14b.

The same arrangement as in the plate yoke 14a shown in FIG. 4 is provided in the plate yoke 14b. Namely, a cover member covers the spacer 28 and the shielding magnet 30, another cover member covers the spacer 32 and the shielding magnet 34, and the members are fixed.

As described, each of the shielding magnets 30, 34 is protected by corresponding one of the cover members 38, 44, enabling to prevent. damage to the shielding magnets 30, 34. Further, since the cover members 38, 44 are nonmagnetic members, it is possible to reliably reduce magnetic flux leakage without shorting and shielding magnetic flux generated by the shielding magnets 30, 34.

Further, since the distances T1 and T2 are not smaller than 2 mm, even if a magnetic object is pulled by the shielding magnets 30, 34, the attraction is reduced, and therefore it is easy to remove the sticking object off the cover members 38, 44.

The bottom surface of the plate yoke 14b is provided with legs 48 at positions corresponding respectively to the two supporting yokes 26. Further, two legs 50 are attached on the flat portion of the bottom surface of the front portion 16b of the plate yoke 14b. The legs 48, 50 are nonmagnetic members. This makes sure that the legs 48, 50 are not attracted by the shielding magnets 30, 34 during assembling operation, thereby making sure that the workers are free from the danger.

According to the magnetic field generator 10, the spacer 28, the shielding magnet 30 and the cover member 38 are assembled to the plate yoke 14a in the following method.

Figure 6:
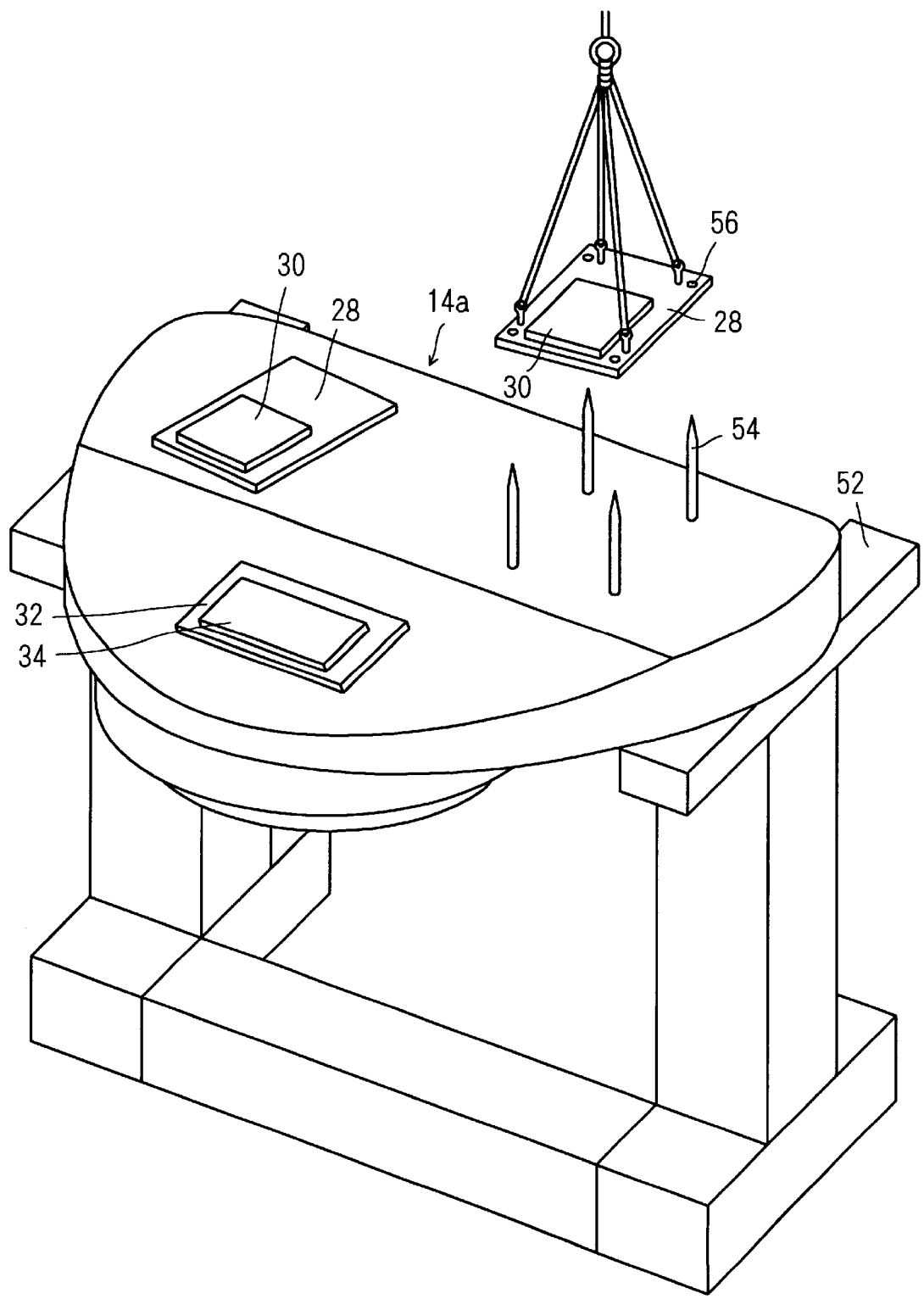
FIG. 6 shows a diagram illustrating a method of assembling a shielding magnet and a spacer.

Specifically, referring to FIG. 6, first, two edge portions of the plate yoke 14a are supported by a supporting table 52. Then, four guiding rods 54 are erected at predetermined locations of the plate yoke 14a. Next, the shielding magnet 30 is fixed by an adhesive for example, to a predetermined location on the spacer 28. Then, the spacer 28 is lifted by a crane for example, and moved to above the plate yoke 14a. The spacer 28 is then lowered, allowing each of the guide rods 54 into a corresponding hole 56 of the spacer 28, onto the plate yoke 14a. This makes sure that the spacer 28 and the shielding magnet 30 are disposed at a predetermined location on the plate yoke 14a. Thereafter, the guide rods 54 are removed, the spacer mounting screws 36 are threaded in place, to fix the spacer 28 onto the plate yoke 14a. Then, the spacer 28 and the shielding magnet 30 are covered by the cover member 38, and the cover member 38 is fixed onto the plate yoke 14a by the cover mounting screws 40.

The same applies to the spacer 32, the shielding magnet 34 and the cover member 44, and to the bottom surface of the plate yoke 14b, where the spacers 28, 32, the shielding magnets 30, 34 and cover members 38, 44 are attached.

Description will now cover an experiment conducted to the magnetic field generator 10.

Specifically, measurements were made for cases (1) through (5) shown in FIG. 7. The measurements included magnetic field strength in the center P of the uniform magnetic field space 12a, and a distance from the center P of the uniform magnetic field space 12a to a point right above a center of the plate yoke 14a where magnetic field strength measured 1 mT (1 mT magnetic-field line). The smaller the distance to the 1 mT magnetic-field line, the smaller the magnetic flux leakage. In this experiment, the five cases represent different combinations of the spacers and shielding magnets disposed at the three locations in each of the plate yokes 14a, 14b as described and shown in FIG. 1 through FIG. 3, and FIG. 5.

In the case (1), no members, i.e. no spacers or shielding magnets, were attached. Then, magnetic flux flew in the plate yoke 14a as shown in FIG. 8A, giving a result shown in FIG. 7.

In the case (2), each of the plate yokes 14a, 14b was provided only with iron spacers 28 and 32. Then, reduction of the magnetic flux leakage was only a little, although magnetic field strength was increased by virtual increase in thickness of the plate yokes 14a, 14b as shown in FIG. 8B.

In the case (3), each of the plate yokes 14a, 14b was provided with shielding magnets 30 and 34 by direct bonding. Then, reduction of the magnetic flux leakage was achieved but magnetic field strength in the center P of the uniform magnetic field space 12a was decreased due to partial deterioration in magnetic permeability. This was caused by partial magnetic saturation in the plate yokes 14a, 14b with magnetic flux from the shielding magnets 30, 34 themselves as shown in FIG. 8C.

In the case (4), each of the plate yokes 14a, 14b was provided with nonmagnetic spacers 28 and 32 (made of SUS 304) mounted respectively with the shielding magnets 30 and 34. In this arrangement, the shielding magnets 30, 34 were spaced from the plate yoke 14a and from the plate yoke 14b. As a result, magnetic flux leakage was slightly greater than in the case (3), yet the magnetic flux from the shielding magnets 30, 34 themselves did not influence the magnetic reluctance of the plate yokes 14a, 14b as shown in FIG. 8D. As a result, the magnetic saturation in the plate yokes 14a, 14b was relieved or eased, and magnetic field strength in the center P of the uniform magnetic field space 12a was increased accordingly. However, part of the magnetic flux generated by the shielding magnets 30, 34 found way into the plate yokes 14a, 14b.

In the case (5), each of the plate yokes 14a, 14b was provided with iron spacers 28 and 32 mounted respectively with the shielding magnets 30 and 34. In this arrangement, as shown in FIG. 8E, magnetic flux generated by the shielding magnets 30, 34 flew primarily through the respective spacers 28, 32, and did not influence the magnetic reluctance of the plate yokes 14a, 14b. Further, the iron spacers 28, 32 virtually increased the thickness of the plate yokes 14a, 14b. As a result, magnetic saturation was eased, magnetic field strength was improved, and magnetic flux leakage was decreased.

Therefore, according to the magnetic field generator 10, by providing the spacers 28, 32, the shielding magnets 30, 34 are spaced from the plate yoke 14a and from the plate yoke 14b, easing magnetic saturation in the plate yokes 14a, 14b, thereby increasing magnetic field strength in the space 12. Further, if the spacers 28, 32 are made of magnetic material such as iron, it becomes possible to reduce magnetic flux leakage. In an open type magnetic field generator, magnetic flux tends to concentrate where the yokes are connected with each other, making the generator prone to local magnetic saturation. Therefore, the present invention is effective particularly in an open type magnetic field generator such as the magnetic field generator 10.

By using the sintered rare-earth magnets, which have strong magnetism, as the shielding magnets 30, 34, together with the spacers 28, 32, magnet flux leakage can be reduced more effectively with a smaller amount of magnet, without causing magnetic saturation.

If each of the plate yokes 14a, 14b is to be mounted directly with the shielding magnets 30 and 34, strong attraction develops between the plate yoke 14a and the shielding magnets 30, 34 and between the plate yoke 14b and the shielding magnets 30, 34, making difficult to dispose the shielding magnets 30, 34 accurately and safely onto predetermined places. However, according to the magnetic field generator 10, the spacers 28, 32 are first mounted with the shielding magnets 30, 34 respectively, and then the spacers 28, 32 are mounted onto main surfaces of the plate yokes 14a, 14b. Therefore, the shielding magnets 30, 34 can be disposed easily onto respective desired locations on the spacers 28, 32, and the magnetic field generator 10 can thus be assembled safely. This invention is more effective if the shielding magnets 30, 34 are provided by sintered rare-earth magnets.

In general, magnetic flux leakage decreases if the thickness of the plate yoke is increased. However, the thickness of the plate yoke will be as much as 30 cm if the magnetic field of 0.35 T for example is to be generated.

Such a magnetic field generator will weigh 20 tons approximately, requiring increased floor strength in installation, limiting the place of installation, and demanding great effort in transportation. These factors no longer allow further increase in the plate yoke thickness. For this reason, the plate yoke is made thin to an extent not to cause magnetic flux to saturate. For example, as in the magnetic field generator 10, the front portions 16a, 16b of the plate yokes 14a, 14b are made thin respectively for reduced weight of the generator.

With such an arrangement however, magnetic flux leakage is unavoidable at places where magnetic flux concentrates, due to magnetic saturation in the yokes. According to the magnetic field generator 10, the shielding magnets 30, 34 are disposed at such places as necessary, at thinned portions of the plate yokes 14a, 14b for example, via the respective spacers 28, 32. This arrangement makes possible to reduce the magnetic flux leakage, while not increasing the thickness of the plate yokes 14a, 14b themselves but facilitating overall weight reduction of the magnetic field generator 10.

The present invention is suitable especially to a magnetic field generator which generates a strong magnetic field not smaller than 0.3 T in the uniform magnetic field space 12a.

Since an MRI apparatus is installed in a hospital, electronic equipment in the hospital can malfunction if an amount of magnetic flux leakage is large. Further, a cardiac pacemaker buried in a patient can malfunction if the patient comes inside a strong magnetic field. In order to confine a strong magnetic field not smaller than 0.5 mT within a small space, a major magnetic shielding work must be performed, or a large space must be provided for installation. These problems can be eased by the present invention that can reduce the magnetic flux leakage.

It should be noted that the spacer and the shielding magnet may be provided only in one of the plate yokes 14a and 14b.

Further, the present invention is applicable to a magnetic field generator comprising a single supporting yoke or four supporting yokes. For example, the present invention is applicable to such a magnetic field generator as disclosed in Japanese Patent Laid-Open No. 2000-139874.

The present invention being thus far described and illustrated in detail, it is obvious that these description and drawings only represent an example of the present invention, and should not be interpreted as limiting the invention. The spirit and scope of the present invention is only limited by words used in the accompanied claims.

What is claimed is:

1. A magnetic field generator comprising:
   a pair of plate yokes opposed to each other with a space in between the plate yokes;
   a permanent magnet disposed on a main surface of each plate yoke, the respective main surfaces of the plate yokes being opposed to each other;
   a shielding magnet provided on another main surface, in at least one of the plate yokes; and
   a spacer placed between the plate yoke and the shielding magnet.

2. The generator according to claim 1, wherein the spacer is made of magnetic material.

3. A magnetic field generator comprising:
   a pair of plate yokes opposed to each other with a space in between the plate yokes;
   not more than two supporting yokes magnetically connecting the plate yokes;
   a permanent magnet disposed on a main surface of each plate yoke, the respective main surfaces of the plate yokes being opposed to each other;
   a first shielding magnet and a second shielding magnet provided respectively at a forward portion on an open side and at a rearward portion, of another main surface, in at least one of the plate yokes;
   a first spacer placed between the plate yoke and the first shielding magnet; and
   a second spacer placed between the plate yoke and the second shielding magnet.

4. A magnetic field generator comprising:
   a pair of plate yokes opposed to each other with a space in between the plate yokes;
   a permanent magnet disposed on a main surface of each plate yoke, the respective main surfaces of the plate yokes being opposed to each other;
   a shielding magnet provided on another main surface, in at least one of the plate yokes;
   a spacer placed between the plate yoke and the shielding magnet; and
   a cover member provided over only the shielding magnet or fixed to the plate yoke.

5. The generator according to claim 4, wherein the cover member is made of nonmagnetic material.

6. The generator according to claim 5, wherein a distance not smaller than 2 mm is provided between an outer surface of the cover member and a surface of the shielding magnet.

7. A magnetic field generator comprising:
   a pair of plate yokes opposed to each other with a space in between the plate yokes;
   a permanent magnet disposed on a main surface of each plate yoke, the respective main surfaces of the plate yokes being opposed to each other;
   a shielding magnet provided on another main surface, in at least one of the plate yokes;
   a spacer placed between the plate yoke and the shielding magnet; and
   a nonmagnetic leg formed on said another main surface of the plate yoke on which the shielding magnet is provided.

8. A magnetic field generator comprising:
   a pair of plate yokes opposed to each other with a space in between the plate yokes;
   a permanent magnet disposed on a main surface of each plate yoke, the respective main surfaces of the plate yokes being opposed to each other, wherein between the permanent magnets of the plate yokes is a uniform magnetic field space formed;
   a supporting yoke magnetically connecting the plate yokes and providing a continuous open space having an opening angle not smaller than 150 degrees as viewed from a center of the uniform magnetic field space between the permanent magnets;
   a shielding magnet provided correspondingly to the open space, on another main surface, in at least one of the plate yokes, wherein the plate yoke has a gradually decreasing thickness, with said another main surface of the plate yoke having a sloped surface, the shielding magnet being provided on the sloped surface; and
   a spacer placed between the plate yoke and the shielding magnet.

9. A magnetic field generator comprising:
   a pair of plate yokes opposed to each other with a space in between the plate yokes;
   a permanent magnet disposed on a main surface of each plate yoke, the respective main surfaces of the plate yokes being opposed to each other, wherein between the permanent magnets of the plate yokes is a uniform magnetic field space formed;
   a supporting yoke magnetically connecting the plate yokes and providing a continuous open space having an opening angle not smaller than 150 degrees as viewed from a center of the uniform magnetic field space between the permanent magnets;
   a shielding magnet provided correspondingly to the open space, on another main surface, in at least one of the plate yokes, wherein a magnetic field not smaller than 0.3 T is generated in the uniform magnetic field space; and
   a spacer placed between the plate yoke and the shielding magnet.

10. The generator according to one of claims 1 through 8, wherein the shielding magnet is provided by a sintered rare-earth magnet.

* * * * *